United States Patent
Kwon et al.

(10) Patent No.: US 6,803,251 B2
(45) Date of Patent: Oct. 12, 2004

(54) INTEGRATED DEVICE PACKAGE AND FABRICATION METHODS THEREOF

(75) Inventors: Yong Tae Kwon, Daeku (KR); Jin Sung Kim, Choongcheongbuk-Do (KR)

(73) Assignee: Hyundai Electronics Industries Co., Ltd., Kyunggi-do (KR)

( * ) Notice: Subject to any disclaimer, the term of this patent is extended or adjusted under 35 U.S.C. 154(b) by 81 days.

(21) Appl. No.: 09/907,600

(22) Filed: Jul. 19, 2001

(65) Prior Publication Data

US 2001/0041390 A1 Nov. 15, 2001

Related U.S. Application Data

(62) Division of application No. 09/237,228, filed on Jan. 26, 1999, now Pat. No. 6,277,734.

(30) Foreign Application Priority Data

Feb. 10, 1998 (KR) ................................................ 98/3803

(51) Int. Cl.[7] .......................... H01L 21/44; H01L 21/48; H01L 21/50
(52) U.S. Cl. ......................... 438/106; 257/730; 257/782
(58) Field of Search ............................... 257/730, 731, 257/733, 739, 773, 774, 775, 779, 780, 690, 692, 676, 684, 798; 438/117, 118, 121, 124, 125, 109, 123

(56) References Cited

U.S. PATENT DOCUMENTS

| | | | |
|---|---|---|---|
| 4,437,141 A | | 3/1984 | Prokop ........................ 257/700 |
| 4,783,697 A | * | 11/1988 | Benenati et al. ............... 357/80 |
| 5,293,067 A | | 3/1994 | Thompson et al. .......... 257/698 |
| 5,296,738 A | * | 3/1994 | Freyman et al. ............. 257/684 |
| 5,363,279 A | | 11/1994 | Cha ............................. 361/767 |
| 5,635,670 A | * | 6/1997 | Kubota et al. .............. 174/52.1 |
| 5,650,593 A | | 7/1997 | McMillan et al. ........... 257/700 |
| 5,729,437 A | | 3/1998 | Hashimoto ................... 257/698 |
| 5,765,280 A | | 6/1998 | Joshi ............................ 257/668 |
| 5,808,872 A | * | 9/1998 | Ozawa ......................... 361/760 |
| 5,825,084 A | | 10/1998 | Lau et al. ..................... 257/700 |
| 5,864,092 A | | 1/1999 | Gore et al. ................... 257/700 |
| 5,966,052 A | | 10/1999 | Sakai ........................... 257/692 |
| 5,981,314 A | * | 11/1999 | Glenn et al. ................. 438/127 |
| 6,162,997 A | * | 12/2000 | Memis ......................... 174/260 |

FOREIGN PATENT DOCUMENTS

JP 04026090 A * 1/1992

* cited by examiner

Primary Examiner—Wael Fahmy
Assistant Examiner—Dana Farahani
(74) Attorney, Agent, or Firm—Fleshner & Kim, LLP

(57) ABSTRACT

The present invention relates to a chip sized integrated circuit package. A device package embodying the invention includes: an insulative substrate having a plurality of conductive first lands formed on an upper surface of the substrate and a plurality of conductive second lands formed on a lower surface of the insulating substrate; a plurality of via holes formed in the substrate adjacent the first and second lands; a conductive film formed on inner walls of the via holes and connecting corresponding ones of the first and second lands; and at least one cavity in the substrate that has an edge extending along a in centerline of a row of the via holes. A semiconductor chip having a plurality of bond pads is attached to a center portion of the upper surface of the substrate, and a plurality in of wires connect corresponding ones of the bond pads and the first lands. An insulation resin covers the integrated circuit chip, the wires, the first lands, and the upper surface of the substrate.

20 Claims, 8 Drawing Sheets

INTEGRATED DEVICE PACKAGE AND FABRICATION METHODS THEREOF

This application is a divisional of application Ser. No. 09/237,228 filed Jan. 26, 1999 now U.S. Pat. No. 6,277,734.

BACKGROUND OF THE INVENTION

1. Field of the Invention

The present invention relates to an integrated device package, and more particularly, to a semiconductor device package, and fabrication methods thereof.

2. Background of the Related Art

Recently, there have been numerous studies on fabricating a semiconductor package having approximately the same size as a semiconductor chip. One type of such a small package, known as a Bottom Leaded Package (BLP), has leads of a lead frame that are stepped, and a semiconductor chip is mounted on the leads. The lead frame and the semiconductor chip are connected and packaged in a molding resin such that outer portions of the leads are exposed on at least a bottom surface of the semiconductor package. A BLP semiconductor package will now be described with reference to FIGS. 1–8.

FIG. 1 is a vertical cross-sectional diagram of a background art BLP semiconductor package. As shown therein, a lead frame has leads 2 that are downwardly stepped, and a semiconductor chip 4 is attached to the leads 2 by a double-faced adhesive tape 3. Also, a plurality of bond pads 5 formed on the semiconductor chip 4 are connected to the lead frame by metal wires 6. An insulation resin 7 packages the metal wires 6, the semiconductor chip 4, and a predetermined portion of the lead frame. Bottom portions of the leads 2 are not covered by the insulation resin 7. The exposed portions of the leads can be used to connect the semiconductor chip 4 to external circuits.

FIG. 2 is a bottom view of the BLP semiconductor package shown in FIG. 1. As shown therein, the bottom portions of the leads 2 are exposed, and the remaining portions of the leads 2 are covered by the insulation resin 7.

A background art fabrication method of the BLP semiconductor package will now be described with reference to FIGS. 3–8. First, a lead frame 1, as shown in FIG. 3, is provided. The lead frame may be in the form of a long thin strip to which multiple semiconductor chips will be attached. As shown in FIG. 4, the leads are step shaped such that a center portion 1 of a predetermined area of the lead frame rises above each of the leads 2. Next, as shown in FIG. 5, a double-faced adhesive tape 3 is attached to the lower portions of the leads 2 of the lead frame. A semiconductor chip 4, having a plurality of bond pads 5, is fixedly attached to the leads 2 with the double-faced adhesive tape 3.

As shown in FIG. 6, corresponding bond pads 5 and leads 2 are connected by a plurality of wires 6. Next, as shown in FIGS. 7 and 8, a molding process is performed, so that an insulation resin 7 packages a predetermined portion of the lead frame, the semiconductor chips, and the wires 6. Bottom portions of the leads 2 remain exposed. Any resin flashes attached to the leads 2 are removed, and the leads 2 are plated.

In some instances, multiple BLP packages will be formed in strips, using a lead frame like the one shown in FIG. 3. FIG. 7 is a vertical cross-sectional diagram of a BLP semiconductor package strip. In this instance, it is necessary to cut the strip along each line X–X', to separate the strip into individual, complete BLP semiconductor packages, as shown in FIG. 8.

The background art BLP semiconductor package described above has several problems. When attempts are made to fabricate a package having over 40 pins, defects such as a solder bridge between the pins, can occur. Further, while the output terminals of the semiconductor package are exposed at a bottom surface of the insulation resin, each exposed portion of the output terminals has little or no height. Therefore, it may be difficult to form a solder filet to connect the leads to a circuit board, and a reliability of the solder joint can be poor. Moreover, since resin flashes may be attached to the leads after the molding process, all packages may not have the same quality.

SUMMARY OF THE INVENTION

An object of the present invention is to obviate the problems described above.

Another object of the present invention is to provide a high pin count on a very small package. A further object of the present invention is to improve the joint reliability.

To achieve these and other objects, and in accordance with the purpose of the present invention, a substrate for a semiconductor device package embodying the invention includes: an insulation substrate; a plurality of conductive first lands formed on a first surface of the insulation substrate; a plurality of conductive second lands formed on a second surface of the insulation substrate; a plurality of via holes formed in the insulation substrate adjacent the first lands and the second lands; a plurality of conductive media formed on inner walls of the via holes and connecting respective ones of the first and the second lands, and at least one cavity formed in the substrate, wherein an edge of the cavity extends along a row of the via holes.

A semiconductor device package embodying the invention includes: the above-described substrate; an integrated circuit attached to the first surface of the substrate; a plurality of second conductive media connecting corresponding bond pads of the integrated circuit to the first lands; and an insulation resin which packages the integrated circuit, the plurality of second conductive media and the first lands.

A fabrication method of a substrate for semiconductor device package embodying the invention includes the steps of: providing an insulation substrate; forming a plurality of first lands and a plurality of second lands on first and second surfaces, respectively, of the insulation substrate; forming a plurality of via holes in the insulation substrate adjacent the first and second lands; forming a plurality of conductive media on inner walls of the via holes; and forming at least one cavity in the insulation substrate, wherein an edge of the cavity extends along a row of the via holes.

A semiconductor device package fabrication method embodying the invention includes the steps of: attaching an integrated circuit having a plurality of bond pads to the first surface of the above-described substrate; connecting corresponding ones of the bond pads and the first lands on the substrate with a plurality of second conductive media; and packaging the integrated circuit, the plurality of second conductive media and the first lands with an insulation resin.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawing figures in which like reference numerals refer to like elements, and wherein.

DETAILED DESCRIPTION OF PREFERRED EMBODIMENTS

Figure 9:
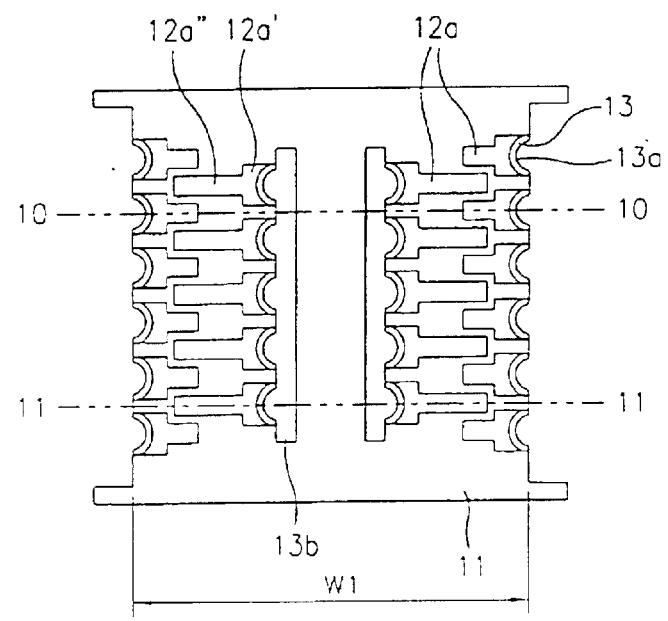
FIG. 9 is a top view of a substrate for an integrated circuit device package according to a preferred embodiment of the present invention.

FIG. 9 is a top view of a module or a substrate of an integrated circuit package according to a preferred embodiment of the present invention. As shown therein, a plurality of conductive first lands 12a are formed on a substrate 11, preferably made of an insulative material, e.g., metal or electrically conductive strips of a prescribed shape. In this preferred embodiment, the conductive first lands 12a include a first portion 12a' and a second portion 12a", where the first portion 12a' is wider than the second portion 12a". The first lands 12a are used as inner leads of the device package, so the number of first lands 12a should be maximized in order to maximize a number of pins of the package. For this reason, the first lands 12a are provided such that they are interleaved with each other. A plurality of via holes 13 are formed at end portions of the first lands 12a, and a conductive metal film 13a is coated on an inner wall of the via holes 13. Cavities or cutouts 13b are formed along rows of the via holes 13. Each cavity 13b is formed so that an edge of the cavity passes through an imaginary vertical center line of a row of the via holes 13. Such cavities are formed at central portions and edge portions of the substrate 11.

Figure 10:
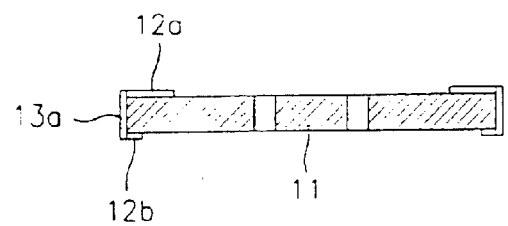
FIG. 10 is a vertical cross-sectional diagram taken along section line 10—10 in FIG. 9.

FIG. 10 is a vertical cross-sectional diagram taken along section line 10—10 of FIG. 9. As shown therein, the conductive metal film 13a is formed on each inner wall of the via holes 13 at the outer portions of the substrate 11. The conductive film 13a can serve as external terminals of the integrated circuit device package. Alternatively, a plurality of second lands 12b formed on a bottom surface of the substrate 11 and connected to the conductive film 13a, can also serve as external leads.

Figure 11:
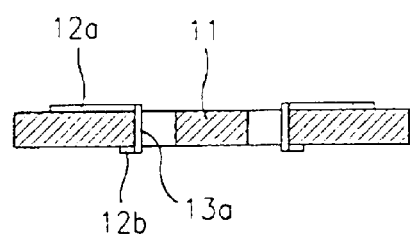
FIG. 11 is a vertical cross-sectional diagram taken along section line 11—11 in FIG. 9.

FIG. 11 is a vertical cross-sectional diagram taken along section line 11—11 in FIG. 9. As shown therein, conductive metal film 13a is formed on each inner wall of the via holes 13 located at the central portions of the substrate 11. The conductive film 13a, or second lands 12b connected to the conductive film 13b, can also serve as external terminals of the semiconductor device package.

Figure 12:
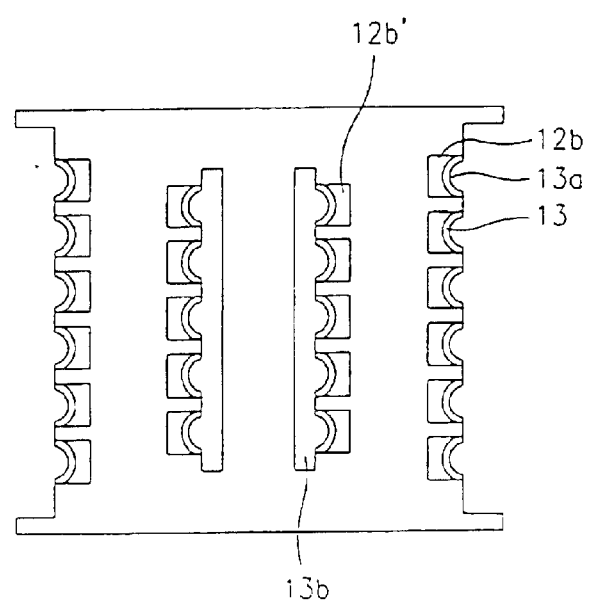
FIG. 12 is a bottom view of a substrate for an integrated circuit device package according to the preferred embodiment of the present invention.
Figure 13:
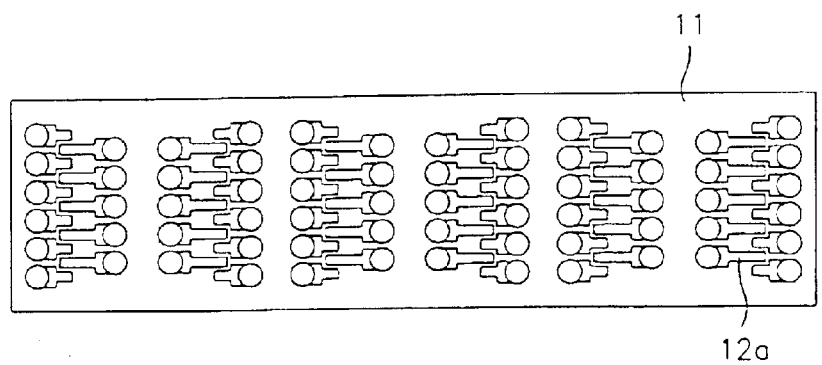
FIGS. 13–15 are diagrams illustrating the steps for making the substrate according to the preferred embodiment of the present invention.
Figure 14:
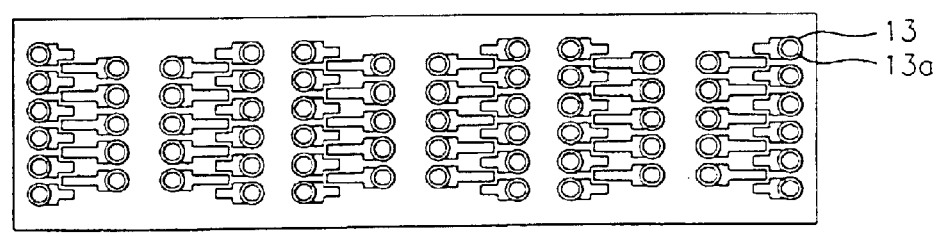
Figure 15:
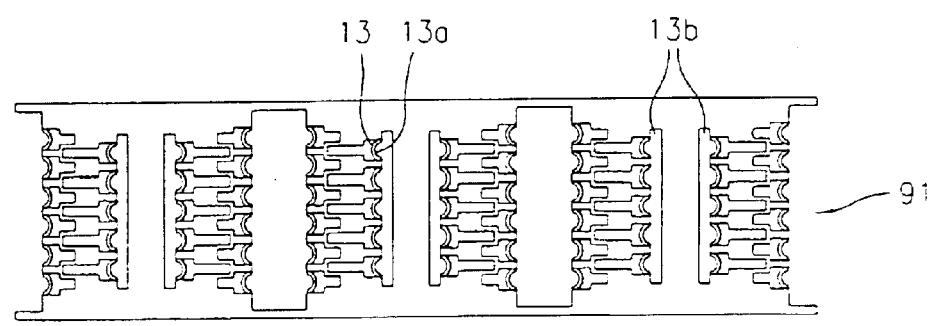

FIG. 12 is a bottom view of the substrate shown in FIG. 9. As shown is in FIG. 12, a plurality of second lands 12b, e.g., metal or electrically conductive strips of a prescribed shape having a first portion 12b', are formed at a bottom of the substrate 11. The width of the first portion 12b' is preferably the same as the width of the first portion 12a' of the first conductive lands 12a. The via holes 13 with the corresponding conductive metal film portions 13a are formed at end portions of the second lands 12b. The first lands 12a and the second lands 12b are electrically connected by the conductive metal film 13a coated on the inner walls of the via holes 13. The first lands 12a serve as inner leads and are connected to the bond pads of an integrated circuit chip when the integrated circuit device package is manufactured. The second lands 12b, and the conductive mental films 13a, serve as outleads which connect external circuits to the integrated circuit chip. FIG. 13–15 are diagrams illustrating the steps of making the substrate 11 according to a preferred embodiment of the present invention. In this description, the resulting substrate can be used to hold multiple integrated circuits. The substrate can then be cut into portions corresponding to a single integrated circuit, or they can be used to hold several integrated circuits.

First, as shown in FIG. 13, a plurality of first lands 12a, which can be conductive metal patterns, are formed on an upper surface of an insulative substrate. These first lands may be interleaved. A plurality of second lands (not shown) are also formed on a lower surface of the substrate. Next, via holes 13 are formed at end portions of the first and second lands. As shown in FIG. 14, a conductive metal film 13a is coated on inner walls of the via holes 13 by plating, sputtering, chemical vapor deposition (CVD) or any other suitable process, known to those skilled in the art. Thus, respective ones of the first lands 12a and the second lands 12b are electrically connected.

A routing process is then performed along an imaginary vertical center line of the via holes 13, and a predetermined portion of the substrate is removed. The result, as shown in FIG. 15, is that each of the via holes 13 is cut in half, and cavities 13b are formed at inner portions and outer portions of the substrate 11. These cavities may be either located at or near the central portion of the insulative substrate, or located at or near the periphery of the insulative substrate. Additionally, there may be a plurality of cavities formed, with at least one of the cavities located at or near the center of the insulative substrate, and at least one other cavity located at or near the periphery of the insulative substrate.

Figure 16A:
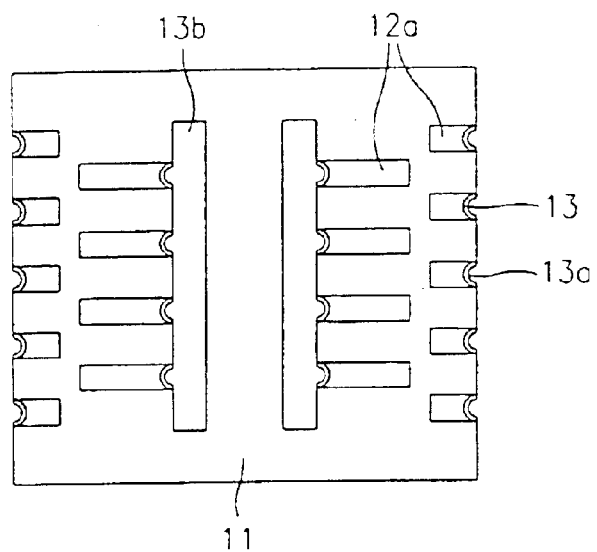
FIGS. 16A–16C are diagrams of a substrate for an integrated circuit device package according to different embodiments of the present invention.
Figure 16B:
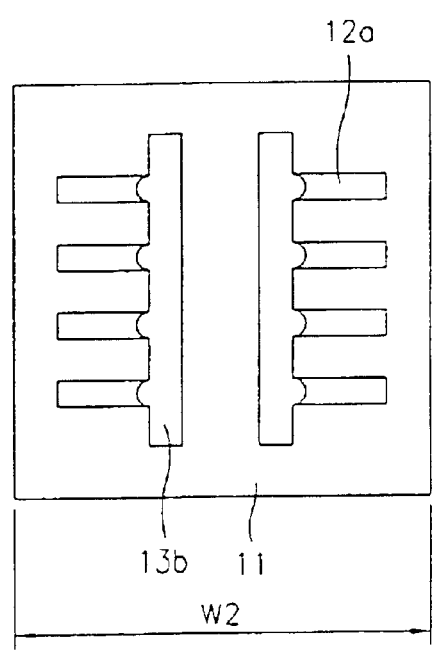

FIG. 16A illustrates a different preferred embodiment of the substrate. The substrate of FIG. 16A is similar to the substrate shown in FIG. 9, except that the plurality of first lands have a substantially uniform width. FIG. 16B illustrates another preferred embodiment of the substrate. This embodiment is similar to the embodiment shown in FIG. 9, except that the outer plurality of first lands are excluded. This allows a width W2 of this embodiment to be smaller than the width W1 of the embodiment shown in FIG. 9. This substrate can be used for both wire or solder bump/ball connection to the bond pads of the integrated chip.

Figure 16C:
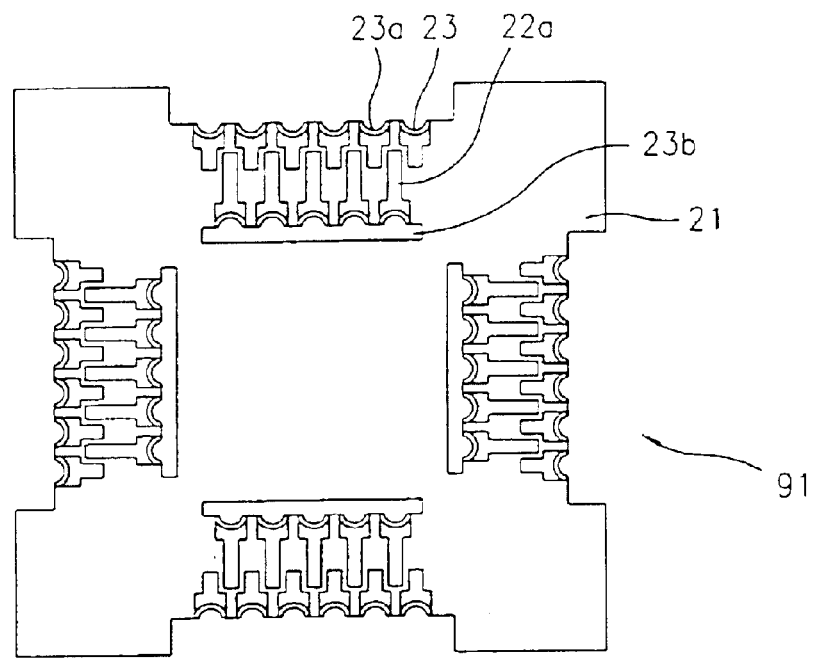

FIG. 16C illustrates a substrate for an integrated circuit device package according to another embodiment of the present invention. As shown therein, a plurality of first lands 22a are arrayed along four sides of an upper surface of a square substrate 21. A corresponding plurality of second lands are also arrayed along four sides of a lower surface of the substrate 21. A plurality of via holes 23 are formed in the substrate at end portions of the first and second lands, and a conductive metal film 23a is coated on each inner wall of the via holes 23. The conductive metal film 23a electrically connects the first and second lands. Next, a plurality of cavities 23b are formed along imaginary vertical center lines of the via holes 23. In the embodiment shown in FIG. 16, the conductive lands and the via holes formed at each of the four edges of the substrate 21 allow one to form an integrated circuit device package with a high pin count.

Figure 17:
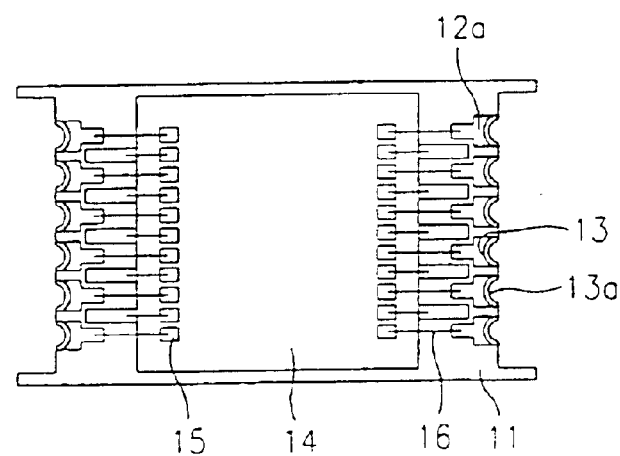
FIG. 17 is a top view of a semiconductor device package according to the preferred embodiment of the present invention before a packaging step is performed.

FIG. 17 is a top view of an integrated circuit device package according to the present invention before a packaging step has been performed. As shown therein, an integrated circuit chip 14, provided with a plurality of bond pads 15, is attached to a center portion of an upper surface of the substrate 11. Respective ones of the bond pads of the integrated circuit chip 14, and the first lands 12a on the substrate 11 are electrically connected by a plurality of wires 16.

Figure 18:
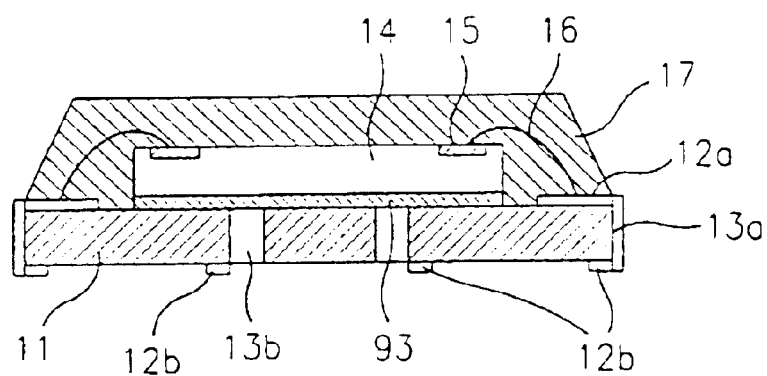
FIG. 18 is a vertical cross-sectional diagram of an integrated circuit device to package with the substrate according to the preferred embodiment of the present invention.

FIG. 18 is a vertical cross-sectional diagram of a finished integrated circuit device package according to the present invention. As shown therein, an integrated circuit chip 14, e.g., a semiconductor chip, having a plurality of bond pads 15 is attached to a center portion of a substrate 11 by a double-faced adhesive tape 93. The bond pads 15 and corresponding ones of the first lands 12a formed on an upper surface of the substrate 11 are electrically connected by metal wires 16. An insulation resin 17 covers the wires 16, the integrated circuit chip 14, and the upper surface of the substrate 11. The conductive metal film 13a, which connects corresponding ones of the first lands 12a and second lands 12b, are externally exposed. The portions of conductive metal film 13a serve as external terminals that may be connected to external circuits.

Figure 1:
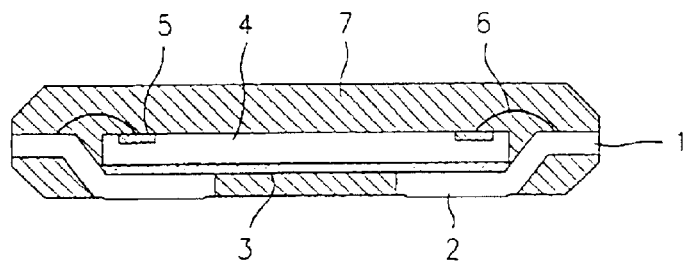
FIG. 1 is a vertical cross-sectional diagram of a background art BLP integrated circuit device package.
Figure 2:
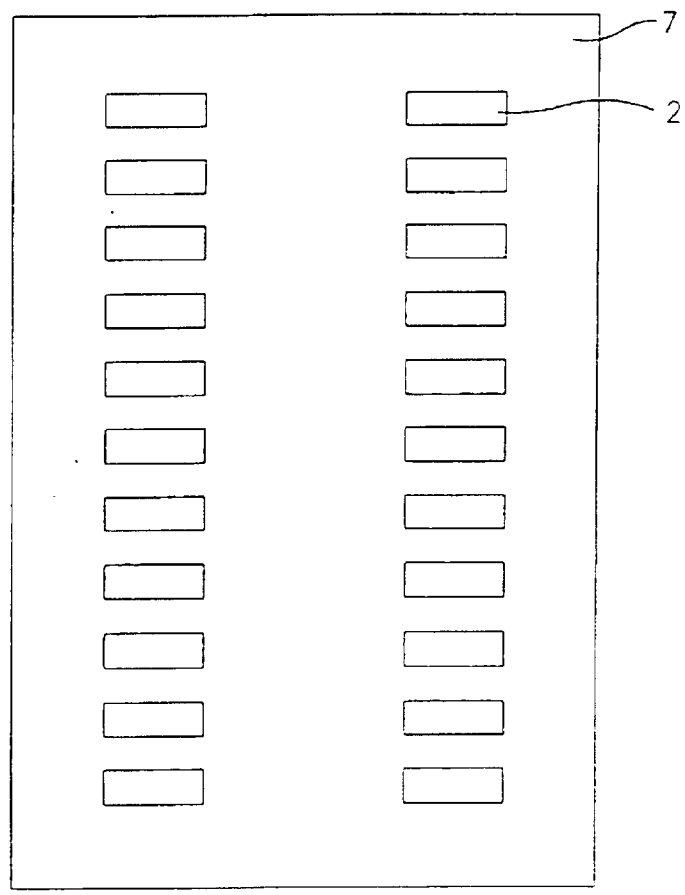
FIG. 2 is a bottom view of the background art BLP integrated circuit device package shown in FIG. 1.
Figure 3:
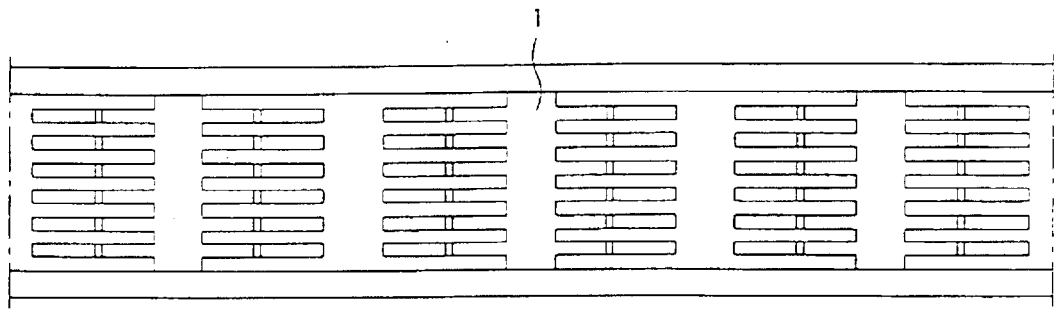
FIG. 3 is a top view of a lead frame used to form a background art BLP integrated circuit device package.
Figure 4:
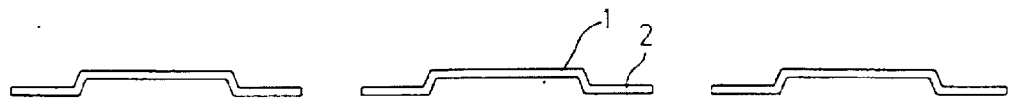
FIG. 4 is a side view of the leads of the lead frame shown in FIG. 3.
Figure 5:
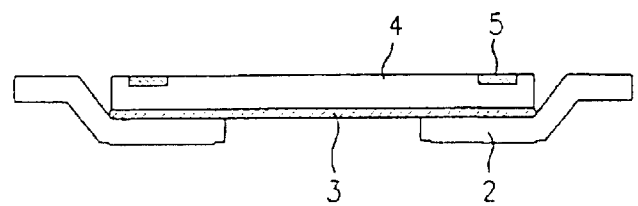
FIGS. 5 and 6 are sectional views showing an integrated circuit mounting in and connection to leads of a lead frame when forming a background art BLP integrated circuit device package.
Figure 6:
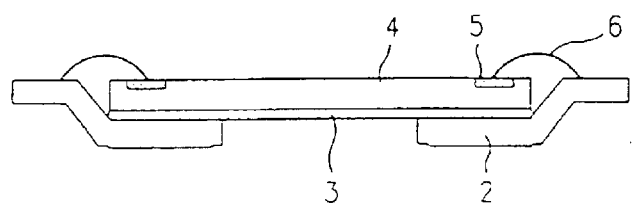
Figure 7:
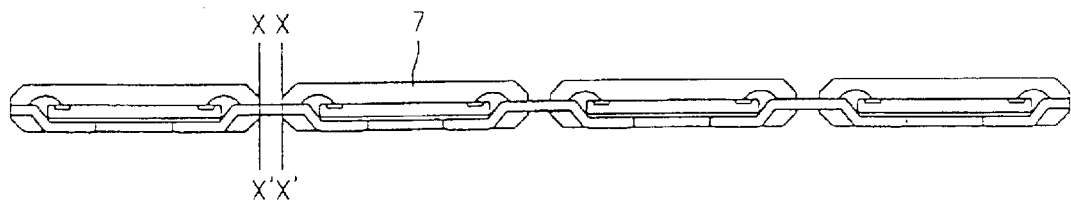
FIG. 7 is a sectional view showing the packaging of multiple integrated circuits in an insulating resin when a background art BLP integrated circuit device package is formed with the lead frame shown in FIG. 3.
Figure 8:
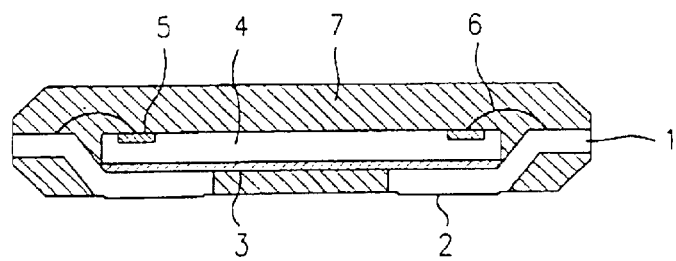
FIG. 8 is a sectional view of a background art BLP integrated circuit device package.
Figure 19:
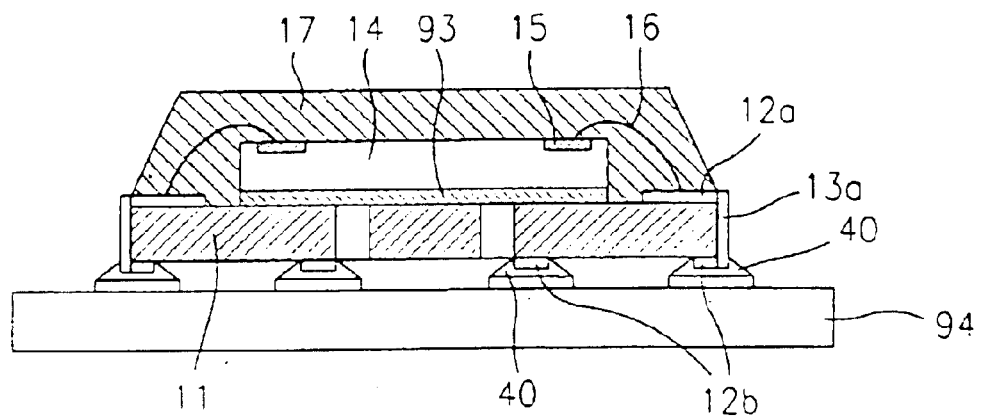
FIG. 19 is a vertical cross-sectional diagram of an integrated circuit device package with the substrate according to the preferred embodiment of the present invention mounted on a circuit board.

FIG. 19 is a vertical cross-sectional diagram of an integrated circuit device package according to the present invention mounted on a system board. As shown in FIG. 19, the second lands 12b and the conductive metal film 13a are connected to a circuit board 94 by solder fillets 40. Solder fillets 40, as shown in FIG. 19, may improve reliability of solder joints as compared with the solder joints of the background art BGA package shown in FIGS. 1 and 8.

Lastly, a fabrication method of an integrated circuit device package according to the present invention will be described. Referring to FIG. 19, a double-faced adhesive tape 93 is attached to an upper surface of the substrate 11, and an integrated circuit chip 14 is fixedly attached to the substrate 11 with the double-faced adhesive tape. Bond pads 15 on the integrated circuit chip 14 and corresponding ones of the first lands 12a are connected by corresponding wires 16. Lastly, a molding resin packaging step is performed so that the wires 16, the first lands 12a, the integrated circuit chip 14, and the upper surface of the substrate 11 are covered by the resin 17.

As described above, an integrated circuit device package and substrate according to the present invention can be used to form a miniaturized device package having a high pin count. Also, a device package according to the invention improves the reliability of solder joints used to connect a device package to the circuit board.

It will be apparent to those skilled in the art that various modifications and variations can be made in the substrate and integrated circuit device package of the present invention without departing from the spirit or scope of the invention, as defined by the following claims. For instance, although the above embodiments have cavities in the substrate with an edge that extends along a center line of a row of holes, the edge of the cavity need not proceed along the center line.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although the conductive film described above and a column of solder may not be structural equivalents in that the conductive film employs a cylindrical surface to electrically connect the first and second lands, whereas a column of solder employs a solid column of conductive material, in the environment of electrically connecting two elements, a conductive film and a column of solder may be equivalent structures.

What is claimed is:

1. A method for making a substrate for an integrated device package, comprising:

forming a plurality of first conductive lands on an upper surface of an insulative substrate;

forming a plurality of second conductive lands on a lower surface of said insulative substrate;

forming via holes through the insulative substrate adjacent end portions of said first and said second lands;

electrically connecting said first lands to corresponding ones of said second lands through said via holes; and removing a portion of said insulative substrate along a row of said via holes to form a cavity that extends through the row of via holes.

2. The method of claim 1, wherein forming a plurality of first conductive lands further comprises forming a plurality of interleaved first conductive lands.

3. The method of claim 1, wherein the removing step is performed such that said cavity is disposed proximate to the center of said insulative substrate.

4. The method of claim 1, wherein the removing step is performed such that said cavity is disposed proximate to the periphery of said insulative substrate.

5. The method of claim 1, wherein the removing step comprises forming a plurality of cavities with at least a first cavity disposed proximate to the center of said insulative substrate and at least a second cavity disposed proximate to the periphery of said insulative substrate.

6. The method of claim 1, wherein the electrically connecting step comprises depositing electrically conductive material upon walls of said via holes.

7. The method of claim 1, wherein the removing step comprises cutting at least a portion of said via holes substantially in half.

8. The method of claim 1, wherein the step of forming a plurality of first conductive lands is performed such that a portion of said plurality of first lands are disposed on a periphery of said insulative substrate.

9. The method of claim 1, wherein said insulative substrate comprises four edges, and wherein the steps of forming said plurality of first conductive lands, forming said plurality of second conductive lands, and forming said via holes are performed such that the first conductive lands, the second conductive lands and the via holes are formed at each of the four edges of said insulative substrate.

10. A method for making an integrated device package, comprising:

forming a plurality of first conductive lands on an upper surface of an insulative substrate;

forming a plurality of second conductive lands on a lower surface of said insulative substrate;

forming via holes at end portions of said first and said second lands;

electrically connecting said first lands with corresponding ones of said second lands through said via holes;

removing a predetermined portion of said insulative substrate along a row of said via holes to form a cavity that extends through the row of via holes;

attaching an integrated circuit chip to said upper surface of said insulative substrate;

electrically connecting said first conductive lands to corresponding pads on said chip; and covering at least a portion of said upper surface of said insulative substrate with a molding material.

11. The method of claim 10, wherein forming a plurality of first conductive lands further comprises forming a plurality of interleaved first conductive lands.

12. The method of claim 10, wherein the removing step is performed such that said cavity is disposed proximate to the center of said insulative substrate.

13. The method of claim 10, wherein the removing step is performed such that said cavity is disposed proximate to the periphery of said insulative substrate.

14. The method of claim 10, wherein the removing step comprises forming a plurality of cavities with at least a first cavity disposed proximate to the center of said insulative substrate and at least a second cavity disposed proximate to the periphery of said insulative substrate.

15. The method of claim 10, wherein the electrically connecting step comprises depositing electrically conductive material upon walls of said via holes.

16. The method of claim 10, wherein the removing step comprises cutting at least a portion of said via holes substantially in half.

17. The method of claim 10, wherein the step of forming a plurality of first lands is performed such that a portion of said plurality of first lands are disposed on a periphery of said insulative substrate.

18. The method of claim 10, wherein said insulative substrate comprises four edges, and wherein the steps of forming said plurality of first conductive lands, forming said plurality of second conductive lands, and forming said via holes results in the formation of first conductive lands, second conductive lands and via holes at each of the four edges of said insulative substrate.

19. The method of claim 1, wherein the step of forming a plurality of first conductive lands results in the first conductive lands having a substantially uniform width.

20. The method of claim 10, wherein the step of forming a plurality of first conductive lands results in the first conductive lands having a substantially uniform width.

* * * * *